(12) United States Patent
Velazquez et al.

(10) Patent No.: US 11,463,072 B1
(45) Date of Patent: Oct. 4, 2022

(54) ADAPTIVE VOLTERRA COMPENSATOR

(71) Applicant: Innovation Digital, LLC, San Diego, CA (US)

(72) Inventors: Scott R. Velazquez, San Diego, CA (US); Ramsin Khoshabeh, San Diego, CA (US)

(73) Assignee: Linearity, LLC, San Diego, CA (US)

( * ) Notice: Subject to any disclaimer, the term of this patent is extended or adjusted under 35 U.S.C. 154(b) by 89 days.

(21) Appl. No.: 15/807,419

(22) Filed: Nov. 8, 2017

(51) Int. Cl.
*H03H 21/00* (2006.01)
*H03M 1/06* (2006.01)
*H03F 1/32* (2006.01)
*H04B 1/40* (2015.01)

(52) U.S. Cl.
CPC ....... *H03H 21/0067* (2013.01); *H03F 1/3247* (2013.01); *H03M 1/0612* (2013.01); *H03F 2200/451* (2013.01); *H04B 1/40* (2013.01)

(58) Field of Classification Search
CPC ........ H03H 21/0067; H03H 2021/0069; H03F 1/3247; H03M 1/0612
See application file for complete search history.

(56) References Cited

U.S. PATENT DOCUMENTS

| | | | |
|---|---|---|---|
| 6,449,110 B1 | 9/2002 | DeGroat et al. | |
| 7,012,772 B1 | 3/2006 | Vis | |
| 7,123,659 B2 | 10/2006 | Orihashi et al. | |
| 7,782,235 B1 | 8/2010 | Velazquez | |
| 7,940,198 B1 | 5/2011 | Velazquez | |
| 8,164,496 B2 | 4/2012 | Velazquez | |
| 8,582,694 B2 | 11/2013 | Velazquez et al. | |
| 9,705,477 B2 | 7/2017 | Velazquez | |
| 2015/0016567 A1* | 1/2015 | Chen | H03F 1/3282 375/297 |
| 2016/0191020 A1* | 6/2016 | Velazquez | H03H 21/0067 341/118 |

* cited by examiner

*Primary Examiner* — Patrick C Chen
(74) *Attorney, Agent, or Firm* — Insigne PC; Trevor Coddington

(57) ABSTRACT

The present invention is a computationally-efficient compensator for removing nonlinear distortion. The compensator operates in a digital post-compensation configuration for linearization of devices or systems such as analog-to-digital converters and RF receiver electronics. The compensator also operates in a digital pre-compensation configuration for linearization of devices or systems such as digital-to-analog converters, RF power amplifiers, and RF transmitter electronics. The adaptive Volterra compensator effectively removes nonlinear distortion in these systems by implementing an adaptive background algorithm to periodically update actual filter coefficients to maintain optimal performance in operating conditions varying over time (e.g., temperature, frequency, signal level, and drift); or both. The xadaptive background algorithm calculates the optimal nonlinear filter coefficients to reduce nonlinear distortion.

12 Claims, 15 Drawing Sheets

ADAPTIVE VOLTERRA COMPENSATOR

BACKGROUND OF THE INVENTION

1. Field of Invention

The present invention relates to electronics and more specifically, to techniques for improving the linear performance of electrical components such as analog-to-digital converters and power amplifiers in radio frequency (RF) transceiver systems.

2. Description of Related Art

An electronic or power amplifier is a device for increasing the power of an input signal. Power amplifiers in most electronic systems are required to be "linear," in that they must accurately reproduce the signal present at their input to achieve efficiency and spectral purity. An amplifier that compresses its input or has a non-linear input/output relationship causes the output signal to splatter onto adjacent frequencies. This causes interference on other frequency channels. Power amplifiers tend to become more non-linear as their power increases towards their maximum rated output.

Power amplifier linearity and efficiency are crucial issues in the design of electronic systems. The power amplifier is one of the most import parts of and usually the largest single contributor to the power consumption of an RF system. Thus, it is desirable to maximize the efficiency of a power amplifier. However, the more efficient power amplifier configuration is used the more nonlinear it usually becomes. Linearity errors in power amplifiers cause harmonic distortion and intermodulation distortion, which can limit the performance of state-of-the-art electronic systems such as, but not limited to radar systems, digital transceivers for wireless 5G communications, laboratory test equipment, medical imaging, and audio and video compression. Reducing errors in digital-to-analog converters, analog-to-digital converters, sample-and-hold circuitry, and buffer and power amplifiers can significantly improve the performance of the critical conversion process.

An analog-to-digital converter (ADC) is a device for converting continuous radio frequency signals into discrete-time sampled, quantized data for subsequent digital processing. Like power amplifiers, analog-to-digital converters in most electronic systems are required to be "linear," in that they must accurately reproduce the signal present at their input to provide a high-resolution digitized version at its output. An analog-to-digital converter with a non-linear transfer function will introduce distortion components, such as harmonic or intermodulation distortion, that limit the effective resolution and dynamic range of the analog-to-digital conversion.

Several common linearization methods exist for improving the linearity of devices such as power amplifiers and analog-to-digital converters, all of which suffer from drawbacks. All conventional linearization methods are limited in their maximum correctable range, which is the region of power output level near the onset of saturation. One method, known as a feedforward technique, is frequently employed and improves linearity, but results in poor power amplifier efficiency.

Pre-distortion is another technique used to improve the linearity of amplifiers. Digital pre-distortion is used to linearize the nonlinear response of a power amplifier over its intended power range. A pre-distortion circuit inversely models an amplifier's gain and phase characteristics and, when combined with the amplifier, produces an overall system that is more linear and reduces the amplifier's distortion. In essence, "inverse distortion" is introduced into the input of the amplifier, thereby cancelling to some degree any non-linearity the amplifier might have. However, the effectiveness of any pre-distortion technique is directly dependent on the accuracy of the pre-distortion transfer function, i.e., the model of the amplifier's gain and phase distortion characteristics. Traditional pre-distortion techniques implement a second-order or third-order polynomial as the transfer function, which improves the linearity of a power amplifier. However, for advanced RF systems with very high instantaneous bandwidths, transfer functions based on second-order or third-order polynomials are not accurate enough to prevent all non-linear distortion. In fact, many RF devices produce irregular nonlinearities that are difficult to model with standard, integer-power polynomial functions. Moreover, traditional pre-distortion techniques typically employ only one transfer function for a power amplifier, which may be suitable for a particular set of operating conditions. However, when operating conditions vary, e.g., temperature, time, or frequency, the transfer function may no longer be suitable to adequately remove non-linear distortion. Accordingly, there is a need for an improved linearization technique that implements higher-order transfer functions and accounts for varying operating conditions.

Digital post-processing is another technique used to improve the linearity of analog-to-digital converters. Digital post-processing is used to linearize the nonlinear response. Digital post-processing inversely models an analog-to-digital converter's nonlinear distortion transfer function such that the deleterious nonlinear distortion components can be subtracted from the output of the analog-to-digital converter to produce an overall system that is more linear and reduces the nonlinear distortion. In essence, "inverse distortion" is introduced into the output of the analog-to-digital converter, thereby cancelling to some degree any non-linearity the analog-to-digital converter might have. However, the effectiveness of any digital post-processing technique is directly dependent on the accuracy of the nonlinear distortion transfer function, i.e., the model of the analog-to-digital converter's nonlinear distortion characteristics. Traditional digital post-processing techniques implement a second-order or third-order polynomial as the transfer function, which improves the linearity of an analog-to-digital converter. However, for advanced RF systems with very high instantaneous bandwidths, transfer functions based on second-order or third-order polynomials are not accurate enough to prevent all non-linear distortion.

U.S. Pat. No. 9,705,477, the disclosure of which is incorporated herein by reference in its entirety, provides a compensator for removing nonlinear distortion utilizing factored Volterra compensators, which may include a second-order factored Volterra compensator, a third-order factored Volterra compensator, and additional higher-order factored Volterra compensators. Inclusion of $N^{th}$-order factored Volterra distortion compensators improves linearization processing performance while significantly reducing the computational complexity compared to a traditional Volterra-based compensator.

Yet, a need exists to adaptively estimate a Volterra model predistortion for a nonlinear system in order to linearize it "on the fly" without the need for any a priori model fitting.

SUMMARY OF THE INVENTION

The present invention overcomes these and other deficiencies of the prior art by providing an adaptive background algorithm to periodically update Volterra filter coefficients to reduce nonlinear distortion. It can be used for pre-distortion linearization (i.e., process the signal digitally before the nonlinear device, such as an RF power amplifier) or for post-processing linearization (i.e., process the signal digitally after the nonlinear device, such as an analog-to-digital converter).

In an embodiment of the invention, a Volterra compensator for removing nonlinear distortion introduced by an electronic system, the Volterra compensator comprising: an inverse Volterra filter of order N, wherein N is equal to or greater than two; and an adaptive filter estimator coupled to the inverse Volterra filter. The adaptive filter estimator calculates optimized nonlinear filter coefficients up to the order N to reduce nonlinear distortion introduced by the electronic system. The optimized nonlinear filter coefficients up to the order N are calculated according to an objective function. The objective function is dependent on a difference between a desired output of the electronic system and an actual output of the electronic system with the Volterra compensator. The inverse Volterra filter of order N and the adaptive filter estimator are implemented in an integrated circuit. The integrated circuit is an embedded processor. The adaptive filter estimator comprises a bandpass filter having a predetermined bandwidth.

In another embodiment of the invention, a method of adaptively estimating predistortion coefficients of an Nth order Volterra system, wherein N is greater than or equal to two, the method comprising the steps of: predistorting the Nth order Volterra system with predetermined first-order predistortion, wherein the predetermined first-order predistortion is estimated based on a probing of the Nth order Volterra system with tones over a bandwidth of the Nth order Volterra system; estimating second-order predistortion coefficients and third-order predistortion coefficients via a modified recursive least squares (RLS) algorithm; and predistorting the Nth order Volterra system with the estimated second-order predistortion coefficients and the estimated third-order predistortion coefficients. Prior to the step of predistorting the Nth order Volterra system with predetermined first-order predistortion, limiting the bandwidth of the Nth order Volterra system to a predetermined sub-bandwidth. The method repeats the steps of: estimating second-order predistortion coefficients and third-order predistortion coefficients via a modified recursive least squares (RLS) algorithm; and predistorting the Nth order Volterra system with the estimated second-order predistortion coefficients and the estimated third-order predistortion coefficients, until convergence. The method may further comprise the steps of estimating Nth order predistortion coefficients, wherein N is greater than three; and predistorting the Nth order Volterra system with the estimated Nth order predistortion coefficients.

The present invention provides numerous advantages such as improving and maintaining extremely high performance of power amplifiers and analog-to-digital converters over a wider range of signal and environmental conditions, with reasonable amount of signal processing resources and adaptively tracking and correcting parameters which may drift with time, temperature, frequency, amplitude, etc. The present invention simplifies or eliminates outboard calibration, significantly improves power amplifier and analog-to-digital converter performance, provides built-in test capability (i.e., system failures can be detected and analyzed), and increases reliability. The adaptive processing algorithms of the present invention efficiently share processing resources already present in adaptive systems (e.g., adaptive digital beamforming), and reduce the performance requirements of the analog circuitry because the digital signal processing is used to dramatically improve performance. In sum, the present invention lowers the cost, power, and size of power amplifiers and analog-to-digital converters while improving linearity and efficiency.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
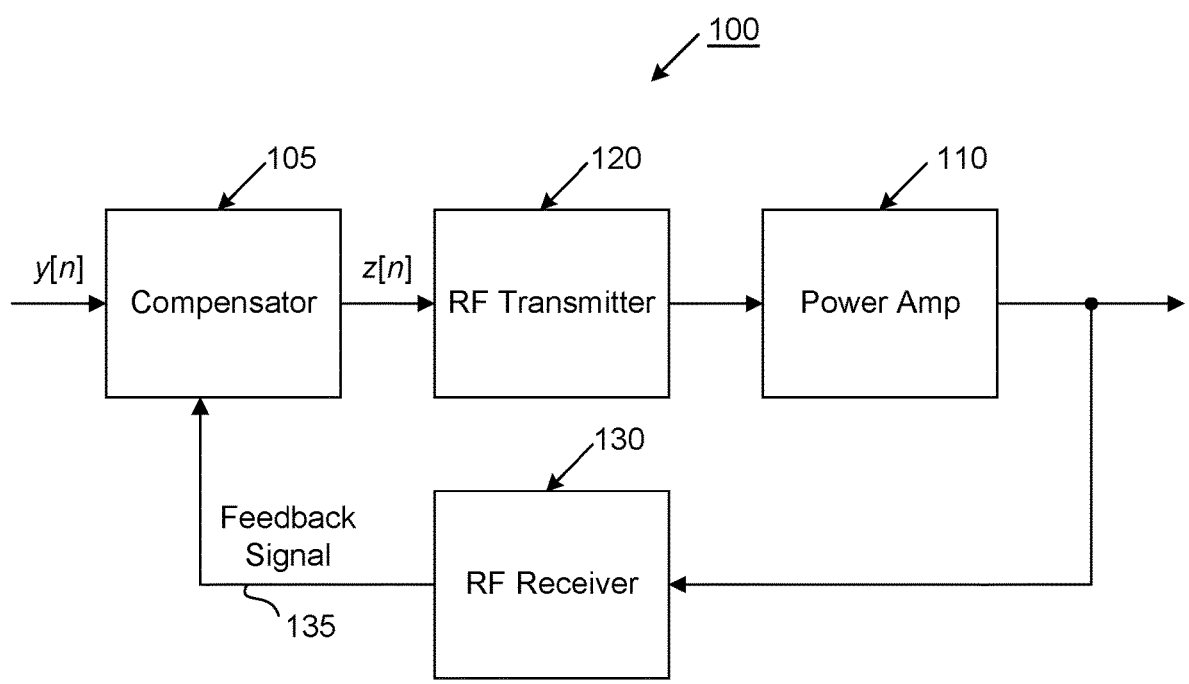
FIG. 1 illustrates an adaptive linearized power amplifier system.

Further features and advantages of the invention, as well as the structure and operation of various embodiments of the invention, are described in detail below with reference to the accompanying FIGS. 1-14B, wherein like reference numerals refer to like elements. Although the invention is described in the context of power amplifiers and analog-to-digital converters, one of ordinary skill in the art readily appreciates that the linearization techniques described herein are applicable to any type of electronic component where it is desired to accurately and adequately eliminate inherent non-linear errors.

FIG. 1 illustrates a general adaptive linearized power amplifier system 100. The system 100 comprises a compensator 105, an RF transmitter 120, a power amplifier 110, and an RF receiver 130. The compensator 100 receives an uncompensated input signal y[n] and produces a compensated output signal z[n]. The RF transmitter 120 comprises a digital-to-analog converter and may optionally include RF upconversion electronics to convert a baseband signal to a higher RF. The power amplifier 110 amplifies the RF signal and introduces the undesired nonlinear distortion. The power amplifier 110 output is tapped and coupled to the RF receiver 130. The RF receiver 130 comprises an analog-to-digital converter and may optionally include RF downconversion electronics to convert the power amplifier output from RF to baseband. The feedback signal 135 is a digitized representation of the tapped power amplifier output, which is used by the compensator 105 to update its behavior, through an adaptive nonlinear distortion estimator 150, for optimal performance.

Figure 2:
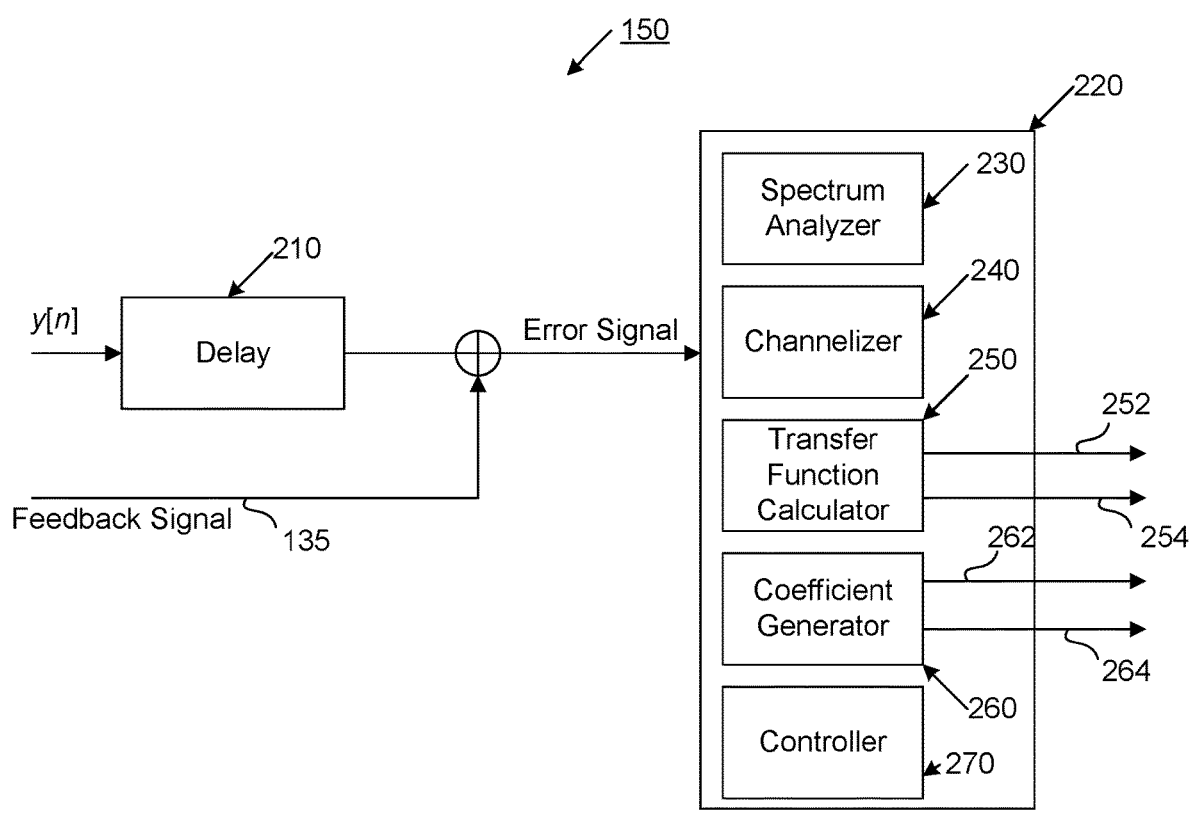
FIG. 2 illustrates the adaptive nonlinear distortion estimator of the compensator shown in FIG. 1.

FIG. 2 illustrates the adaptive nonlinear distortion estimator 150. The estimator 150 comprises a delay 210 and a parameter updater 220. The delay 210 delays the system input, y[n], so that it properly aligns with the feedback signal 135, which is a digitized representation of the power amplifier 210 output and is subject to delays incurred in the processing and circuitry of the system 100. The delayed input signal is combined with the feedback signal 135 via an adder to subtract out an error signal between the compensated output, z[n], and the uncompensated input, y[n]. The error signal is a representation of the difference between the uncompensated input signal, y[n], and the amplifier output, which includes the nonlinear distortion components that the compensator 105 corrects.

This error signal is introduced to the parameter updater 220. The parameter updater 220 comprises a spectrum analyzer 230, a channelizer 240, a transfer function calculator 250, a coefficient generator 260, and a controller 270, the implementation of all of which are apparent to one of ordinary skill in the art. Upon processing of the error signal, the transfer function calculator 250 outputs updated transfer function parameters 252. The coefficient generator 260 outputs updated filter coefficients 262. The spectrum analyzer 230 evaluates the spectral content of the error signal, for example, with a fast Fourier transformation (FFT) operation. The controller 270 uses this spectral content information to determine if the current signal is suitable for estimation of the nonlinear distortion components. For example, if the signal levels are currently too low for accurate estimation, then the controller will wait for a larger signal to appear before continuing with the estimation. The channelizer 240 partitions the error signal into frequency subbands, for example, with a digital filter bank, to analyze the distortion components over different frequencies.

The transfer function calculator 250 stores a table of the current distortion transfer function that maps the delayed input signal to the error signal, for example, in random access memory (RAM). The transfer function calculator 250 may also use a curve-fitting algorithm, the identification and implementation of which are apparent to one of ordinary skill in the art, to fit a polynomial equation to the transfer function. The calculator 250 outputs transfer function parameters 252, which may be this equation or the memory table. The calculator 250 optionally outputs similar transfer function parameters 254, which may be this equation or the memory table, for use in a heuristic compensation process described below. The coefficient generator 260 uses the output of the spectrum analyzer 230 to measure the relative gain and phase shift of the selected nonlinear distortion components. These gain and phase shift measurements are cataloged over frequency for different input signals. Standard digital filter design methods may be used to fit a digital filter to the gain and phase shift measurements to generate the filter coefficients 262. The generator 260 optionally outputs coefficients 264 for use in a heuristic compensation process described below.

Heuristic calibration is also implemented. Heuristic calibration maintains and updates the calibration history over numerous operating conditions, e.g., time, temperature, frequency, signal level, drift, etc. For example, distortion transfer functions are generated for various sets of operating conditions and are stored in a look-up table. In the event that operating conditions change, an applicable set of filters coefficients 262 can be updated periodically to maintain optimal performance in varying conditions over time.

Figure 3:
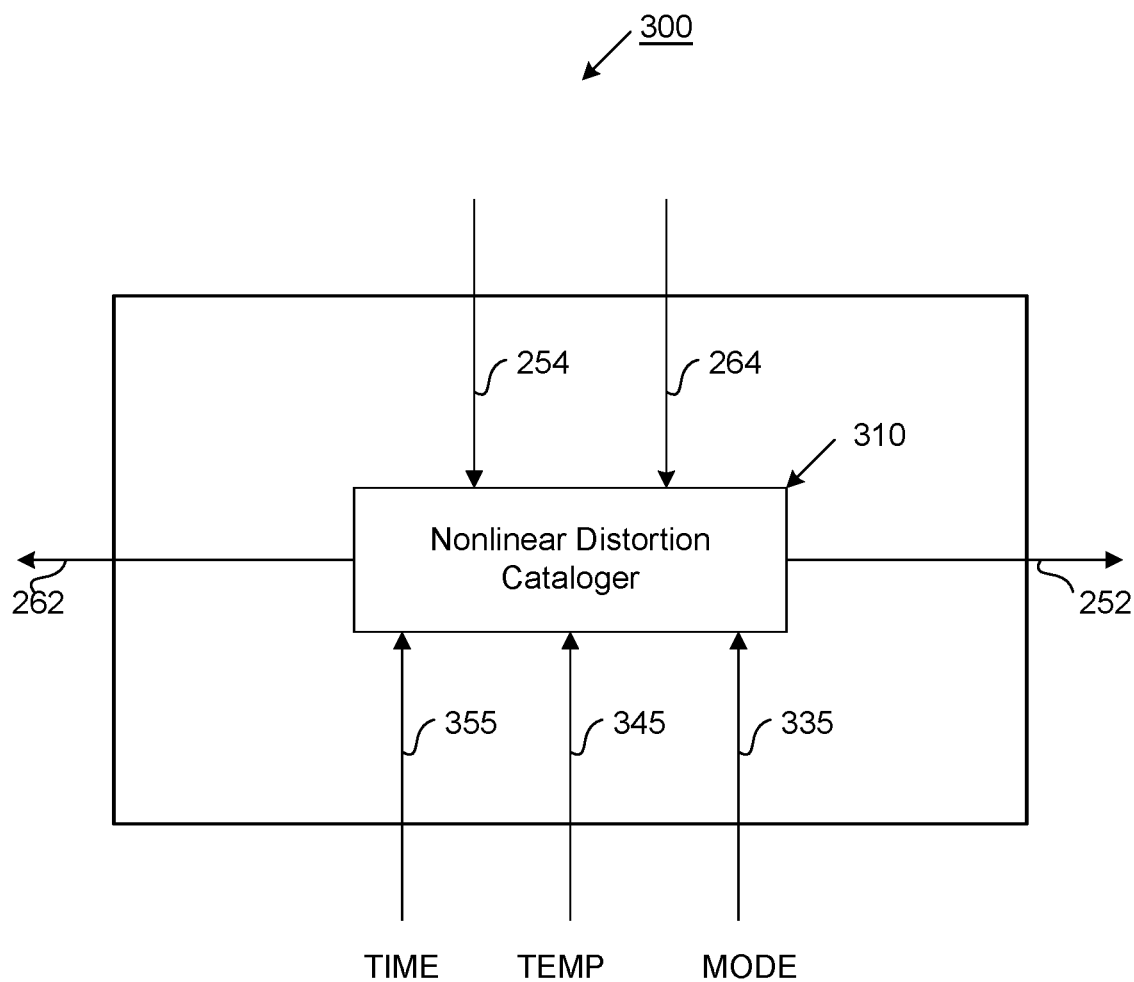
FIG. 3 illustrates a heuristic calibration system.

FIG. 3 illustrates a heuristic calibration system 300. Particularly, the heuristic calibration system 300 comprises a nonlinear distortion cataloger 310, which stores a history of various measurements, including, but not limited to transfer function parameters 254, filter coefficients 264, and other relevant parameters such as mode of operation 335, temperature 345, and time 355. The nonlinear distortion cataloger 310 outputs distortion transfer function parameters 252 and updated filter coefficients 262 that are calculated heuristically based on the current operation conditions, such as time, temperature, and mode of operation. The nonlinear distortion cataloger 310 can record a number of different measurements to allow for accurate interpolation or extrapolation of the transfer function parameters 252 and updated filter coefficients 262, given the RF system's current operating mode, current temperature, other current conditions, and over a range of frequencies. This record of different measurements can be stored in a catalog (not shown). The nonlinear distortion cataloger 310 can extract the most relevant measurements from the catalog in response to the current operating conditions of the system.

For example, the nonlinear distortion cataloger 310 can extract all of the nonlinear distortion level measurements that have been stored in the catalog that are for the current operating mode 335, within 5 degrees Celsius of the current temperature 345, with the last 30 seconds of the current time 355, and over all the frequencies at which measurements have been stored in the mismatch catalog. Repeated measurements at the same frequency can be averaged for a more accurate estimation. Missing measurements for particular frequencies can be interpolated or extrapolated from the extracted measurements. Measurements that vary significantly from previously stored measurements can be discarded since they may indicate a measurement glitch. This process performed by the nonlinear distortion cataloger 310 of extracting the relevant data from the catalog, combining repeated measurements, interpolating or extrapolating missing measurements, and discarding inaccurate measurements is a heuristic process that generates the transfer function parameters 252 and updated filter coefficients 262.

Figure 4:
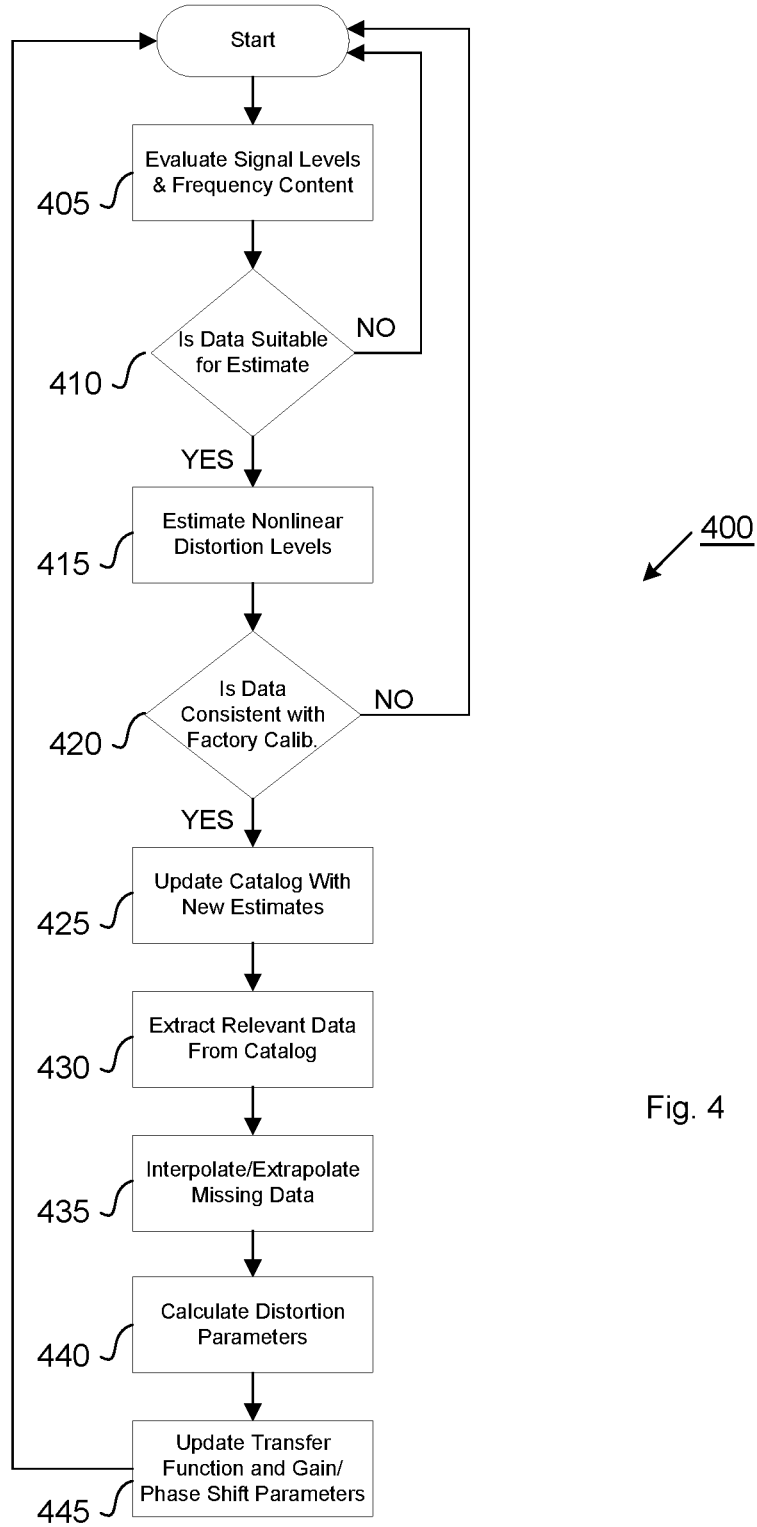
FIG. 4 illustrates a process for heuristically compensating nonlinear distortion.

FIG. 4 illustrates a process 400 for heuristically compensating nonlinear distortion. This process 400 is controlled by the nonlinear distortion cataloger 310 as shown in FIG. 3. The nonlinear distortion cataloger 310 can be implemented as a microprocessor or an embedded processor with a field programmable gate array (FPGA). Particularly, the process 400 begins by evaluating (step 405) the amplitudes and frequency content of the nonlinear distortion levels and determining (step 410) if that data is suitable for accurate estimation of the nonlinear distortion. The accuracy of the estimation can be degraded, for example, if the signal levels are very low (for example, less than −20 dBFS); therefore, for the most accurate estimation, the process can continually monitor the incoming signal until its amplitude is above a predetermined threshold. The single amplitude and frequency content can be measured, in one embodiment, with a FFT analysis of the input signals. A 512-point FFT can be performed with a microprocessor or embedded processor, and the magnitude of each FFT bin can be measured to determine the signal amplitude at various frequencies.

If the signal amplitude and frequency content is suitable, then the nonlinear distortion levels can be estimated (step 415). Optionally, the current estimations can be compared (step 420) to the factory calibration values stored in the catalog to ensure that the current estimations are not significantly different. A significant difference can indicate a component failure, a signal glitch, or other anomaly, whereby a determination can be made that the current estimation is not valid. If the current estimation is determined to be valid, then the new estimates are stored (step 425) in the catalog.

Based on the current operating conditions, such as current operating mode 335, temperature 345, and time 355, the catalog is searched and any relevant measurements are extracted (step 430), such as measurements near the current system temperature or having the same operating mode. If any pertinent measurements are missing from the catalog, they can be interpolated or extrapolated (step 435). For example, the catalog may contain estimates at a few different frequencies, but the values at the remaining frequencies can be interpolated or extrapolated using, in at least one embodiment of the invention, spline data fitting algorithms. Based on the interpolated/extrapolated data, the optimal nonlinear distortion parameters 252 and 262 can be calculated (step 440). The parameters are used to update (step 445) the amplitude and/or phase shift of the pre-distortion signal.

Referring back to FIG. 2, the controller 270 operates in the background to guide the processing of data with the spectrum analyzer 230, channelizer 240, transfer function calculator 250, coefficient generator 260, and nonlinear distortion cataloger 310. The controller 270 may be implemented with a digital signal processor or an embedded processor, for example, a field programmable gate array. A program instantiated in the controller 270 can implement the process 400 for heuristically compensating nonlinear distortion, as shown in FIG. 4.

The controller 270 may also implement an iterative optimization algorithm that repeatedly analyzes the error signal via the spectrum analyzer 230 to adjust the transfer function calculator 250 and the coefficient generator 260 for optimal performance. Standard iterative optimization algorithms, such as a binary search or Newton's Method may be used. For example, the filter coefficients 262 calculated by the coefficient generator 260 may be iteratively optimized to adjust the amplitude and/or phase shift of the pre-distortion signal such that the selected distortion components are nulled in the output.

In general, the power specification for an amplifier is chosen based on the type of signal to be transmitted (e.g., the peak-to-average signal level), the desired power output, and the desired dynamic range (e.g., third-order intercept point (IP3), 1 dB compression point). Conventional amplifiers are often backed off such that the peak power does not exceed the 1 dB compression point (typically, amplifiers are backed off even a few dB more to insure signals remain in the linear operating region). For example, a typical communications signal may have a peak-to-average ratio of 9 dB, so the amplifier may be backed off by approximately 12 dB below its 1 dB compression point to insure linear amplification. The present invention can be used to increase the 1 dB compression point by 3 to 6 dB, which allows the back-off to be reduced commensurately. This corresponds to reducing the necessary power rating for the amplifier by one-half to one-quarter, which significantly improves the amplifier efficiency (i.e., as the back-off decreases, the efficiency increases). Moreover, the present invention provides a 35 to 40 dB improvement to the spurious free dynamic range (SFDR). Conventional linearization techniques only provide a 10 dB improvement.

Standard, commercially-available field programmable gate array (FPGA) chips are capable of digital signal processing at approximately 400 MHz data rate. For data rates higher than 400 MHz, the processing can be transformed into simultaneous parallel channels, for example, using polyphase filtering structures. For example, 4 GHz data can be demultiplexed into 16 lower data rate (250 MHz each) channels for real-time parallel processing in a standard FPGA (providing an instantaneous bandwidth of 2 GHz).

Linearity compensation techniques are described in commonly-owned U.S. Pat. Nos. 6,198,416, and 7,782,235, the entire disclosures of which are all incorporated by reference herein.

The following describes additional layers of processing that can be added to the linearization techniques described above.

Figure 5:
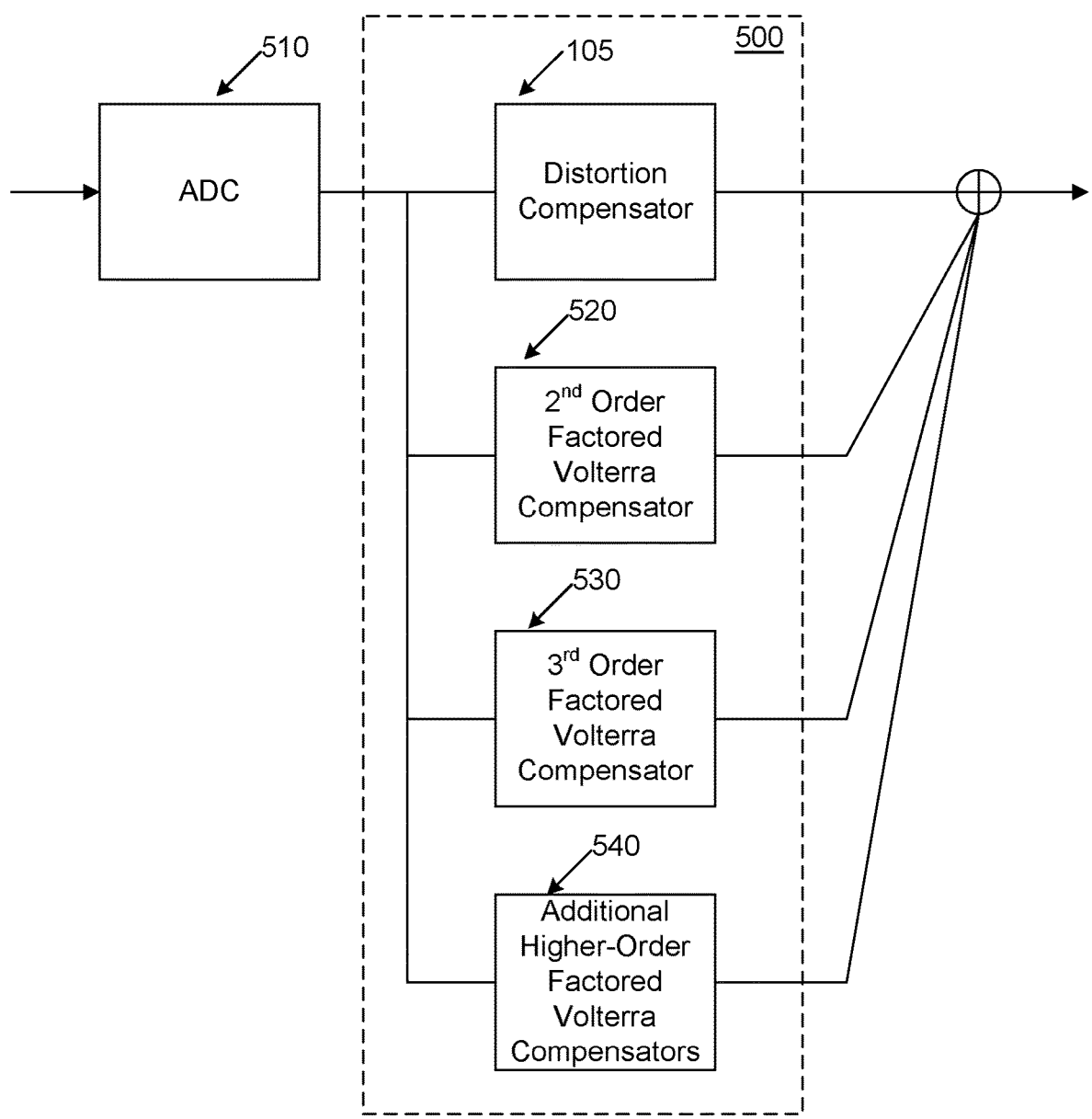
FIG. 5 illustrates a block diagram of a linearity compensator according to an embodiment of the invention.

FIG. 5 illustrates a block diagram of a linearity compensator 500. The linearity compensator 500 operates on an analog-to-digital converter (ADC) 510 and comprises the distortion compensator 105 and one or more factored Volterra compensators, which may include a second-order factored Volterra compensator 520, a third-order factored Volterra compensator 530, and additional higher-order factored Volterra compensators 540. Output of the ADC 510 is coupled to the inputs of the distortion compensator 105, the second-order factored Volterra compensator 520, the third-order factored Volterra compensator 530, and the additional higher-order factored Volterra compensators 540. The outputs of the distortion compensator 105, the second-order factored Volterra compensator 520, the third-order factored Volterra compensator 530, and the additional higher-order factored Volterra compensators 540 are coupled to an adder as shown. Volterra (or Volterra series) is a model for nonlinear behavior where the output of the nonlinear system depends on the input to the system at theoretically all other times, thereby modeling intermodulation distortion of the system. Inclusion of the factored Volterra distortion compensators 520-540 improves linearization processing performance while significantly reducing the computational complexity compared to a traditional Volterra-based compensator without using the distortion compensator 105. In an embodiment of the invention, the factored Volterra distortion compensators 520-540 can be bypassed where only the distortion compensator 105 is implemented.

Figure 6:
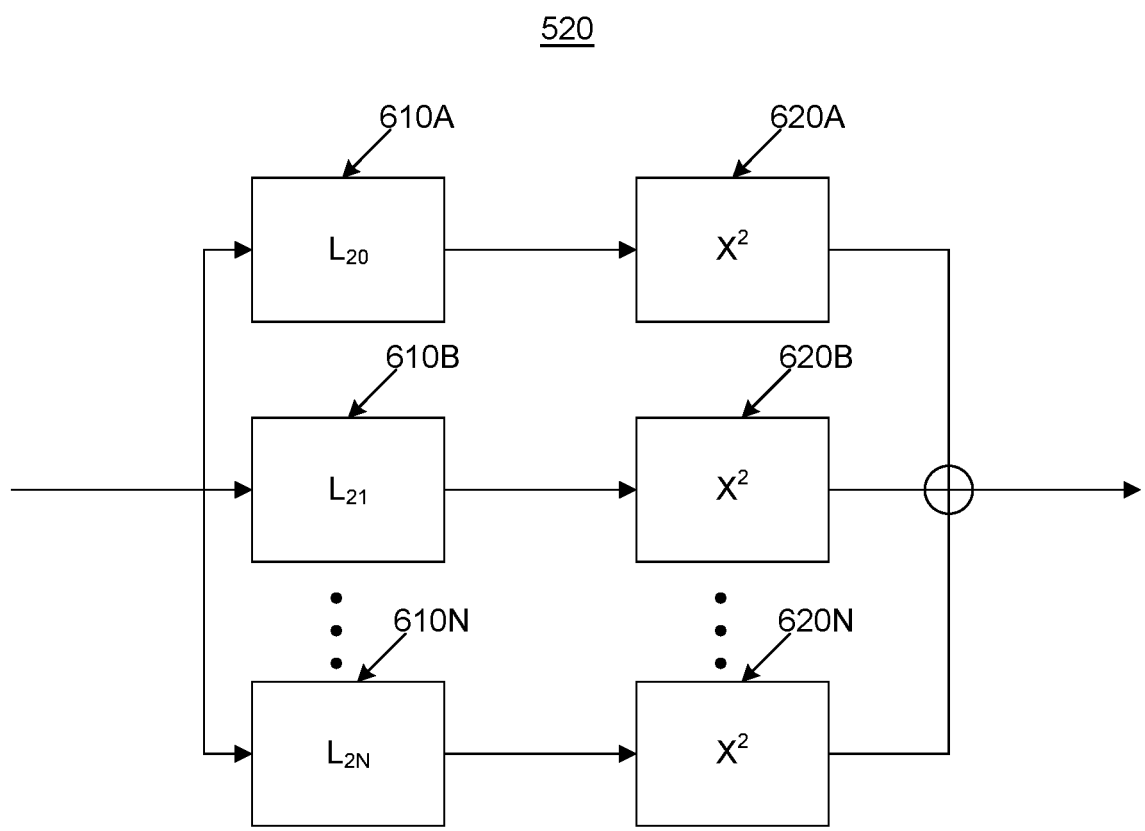
FIG. 6 illustrates the structure of the second-order factored Volterra compensator according to an embodiment of the invention.

FIG. 6 illustrates the structure of the second-order factored Volterra compensator 520. This second-order factored Volterra compensator 520 comprises a number, N, of linear filters 610A-N, each of which has a corresponding squaring function 620A-N. The outputs of the squaring functions 620A-N are added together to produce the compensation signal output of the second-order factored Volterra compensator 520. In an embodiment of the invention, filter 610A is a 4-tap FIR filter. Accordingly, N is equal to 4, i.e., there are four filters 610A-D. The N linear filters 610A-N correspond to the dominant factors of the Volterra series; the process of measuring and factoring the Volterra series is described below.

Figure 7:
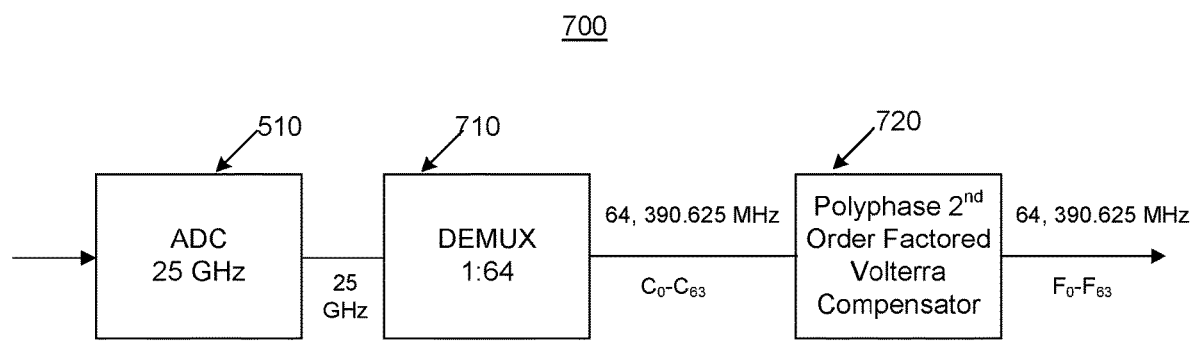
FIG. 7 illustrates the second-order factored Volterra compensator operating in a parallel polyphase configuration according to an exemplary embodiment of the invention.

FIG. 7 illustrates the second-order factored Volterra compensator operating in a parallel polyphase configuration 700. Here, the ADC 510 is operating at 25 GHz. A 1:64 demultiplexer 710 ("DEMUX") is coupled to the output of the ADC 510 and a polyphase second-order factored Volterra compensator 720. Accordingly, the polyphase second-order factored Volterra compensator 720 operates on 64 demultiplexed ADC output signals, referred in the figure as $C_0$-$C_{63}$ at a relatively low data rate of 390.625 MHz. The demultiplexed compensation signal outputs from the polyphase second-order factored Volterra compensator 720 are referred in the figure as $F_0$-$F_{63}$. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. Likewise, a polyphase third-order factored Volterra compensator (not shown) operates on 64 demultiplexed ADC output signals, referred in the figure as $C_0$-$C_{63}$ at a data rate of 390.625 MHz.

Linear filter 610A-N implements factored Volterra kernels which are measured via harmonic probing. Harmonic probing is implemented by injecting known multi-tone test signals into the ADC input. In a preferred embodiment of the invention, the number of tones needed is greater than or equal to the order of the kernel (e.g., greater than or equal to 3-tones for a third-order kernel). The frequency of each test tone is selected to minimize (or eliminate) overlapping components, e.g., harmonics do not have the same frequency as the fundamental tone. Overlapping measurements can be discarded so that only non-overlapping measurements are employed. More tones can be used than required for fewer test signals (e.g., using 3-tone test signals to measure second- and third-order kernels), with the same constraints on overlapping components. Test frequencies are selected to be centered on FFT bins (e.g., prime-coherent sampling) and all combinations are chosen to cover the full N-dimensional frequency space (e.g., for 3-tone combinations, each tone covers the desired frequency range and are calculated, for example, with embedded for-loops for each tone). Symmetry of the Volterra kernels reduces the required number of tone combinations. The amplitude of the test signals is preferably set to near full scale, i.e., saturation, of the system where the distortion is most prominent.

In an alternative embodiment of the invention, test frequencies are selected randomly for uniform coverage over the N-dimensional frequency space. Test signals with too many overlapping components may be discarded. In order to prevent introduction of external non-linear distortion, high-linearity signal combiners are employed and the signal generator outputs' harmonic distortion is filtered via low-pass or band-pass filters.

A frequency domain Volterra kernel is analogous to a multi-dimensional linear filter where the input is $$X_n[k_1, k_2, \ldots, k_n] = X[k_1] * X[k_2] \ldots * X[k_n]$$

and the output is an n-dimensional convolution of input $$X_n(z_1, z_2, \ldots, z_n) = X_n(z_1) X_n(z_2) \ldots X_n(z_n)$$

with n-dimensional Volterra kernel $H_n(z_1, z_2, \ldots, z_n)$. The one-dimensional output in the time domain is the diagonal of n-dimensional output $y_n(k_1, k_2, \ldots, k_n)$.

Since multi-tone sinusoidal inputs in time-domain correspond to dirac delta functions in frequency-domain, the frequency response of the Volterra kernel $H_n(z_1, z_2, \ldots z_n)$ is effectively sampled at the multi-tone frequencies by using multi-tone sinusoidal test signals. The complex frequency response of the one-dimensional output is calculated, for example, with a one-dimensional FFT and evaluated at the frequencies of the harmonics and intermodulation distortion components (i.e., the "sum" frequencies). Care must be taken to appropriately scale the amplitude of the complex frequency response if some of the frequencies in the multi-tone sinusoidal test signal are repeated. This process is repeated for multiple multi-tone sinusoidal such that the Volterra kernel $H_n(z_1, z_2, \ldots z_n)$ is cataloged for many frequencies over the desired bandwidth.

Figure 8:
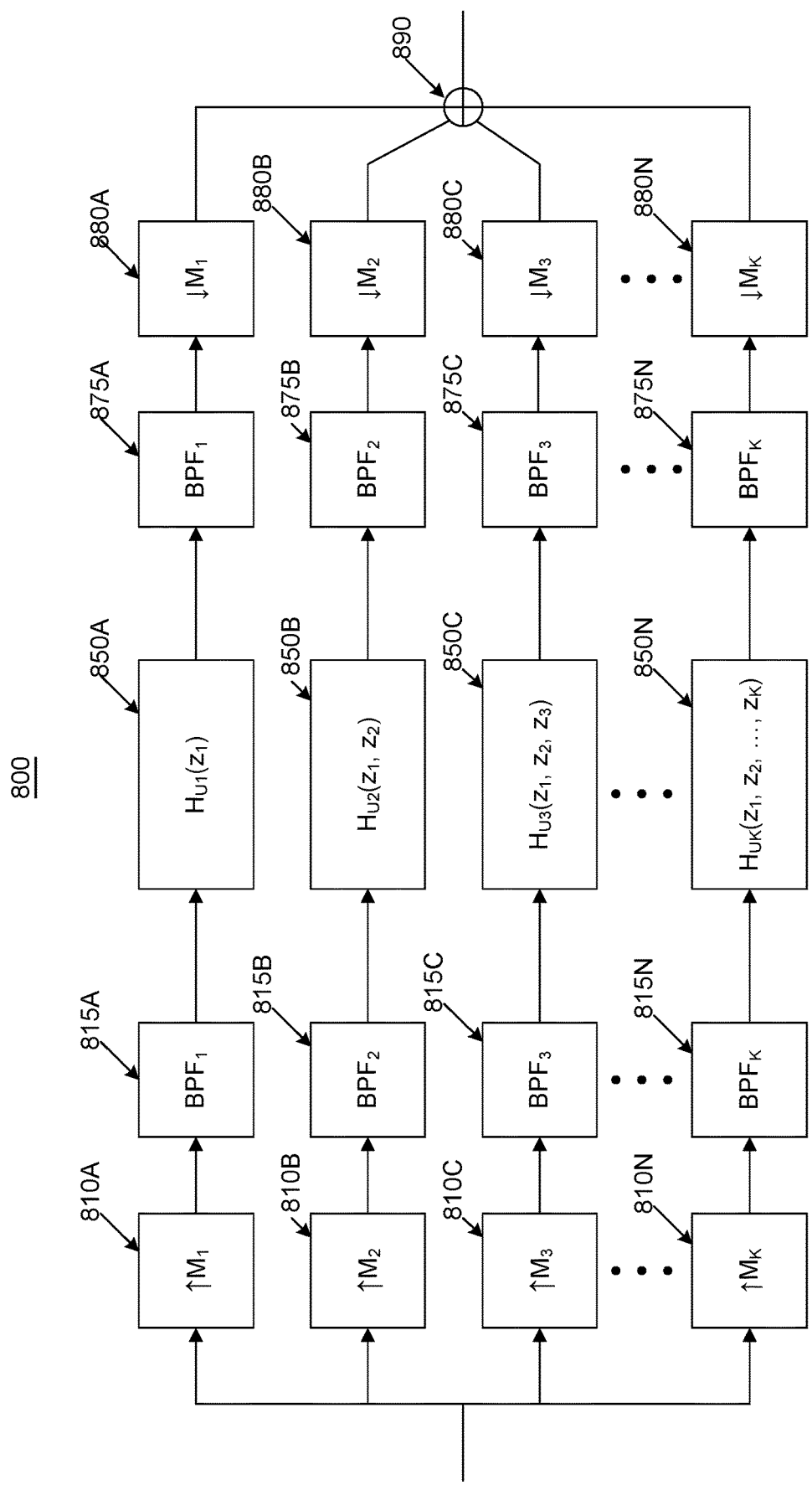
FIG. 8 illustrates a block diagram of a multi-rate Volterra compensator according to an embodiment of the invention.

FIG. 8 illustrates a multi-rate Volterra compensator 800 operated at a sample rate that is commensurate with the bandwidth of the nonlinear distortion that is being modeled. For example, if the maximum frequency in the desired band is $f_1$ and the maximum order of the compensator is 3, then the maximum frequency of the nonlinear distortion is the third harmonic at $3f_1$. Therefore, the factored Volterra compensator can be operated at a minimum sample rate of $6f_1$ to properly resolve the bandwidth of the modeled distortion components according to the Nyquist theorem. Bandpass interpolation is implemented using upsamplers 810A-N and bandpass filters 815A-N and can be used to appropriately increase the sample rate of the multirate Volterra compensator. Increasing the sample rate of the compensator has the effect of only utilizing particular subbands of the upsampled Volterra filters 850A-850N since nonlinear distortion components will not fall at all possible frequencies.

The upsampled Volterra filters 850A-850N can correspond to multi-dimensional upsampled Volterra kernels, where a non-upsampled Volterra filter is "zero-stuffed" by a factor of $M_k$ (i.e., $M_k$ zeroes are inserted between adjacent Volterra kernel coefficients in a multi-dimensional sense). This process is called multi-dimensional upsampling by those skilled in the art. In the frequency domain, the upsampled Volterra filter accurately approximates the desired frequency response in the active subbands, and this frequency response is simply repeated (with conjugate symmetry) in the inactive or "do not care" bands. Since only a subset of Volterra kernel coefficients are non-zero, this greatly simplifies the Volterra filter design algorithm (described below) and greatly reduces the size of the hardware implementation (since the many zero coefficients correspond to simple time delays instead of full multipliers).

For many applications, the bandwidth of the system is limited. Bandpass decimation is implemented with bandpass filters 875A-N and downsamplers 880A-N and may optionally be used to limit the bandwidth of the compensation signal and reduce the sample rate. This greatly reduces the processing resources required by significantly reducing the data rate.

Figure 9:
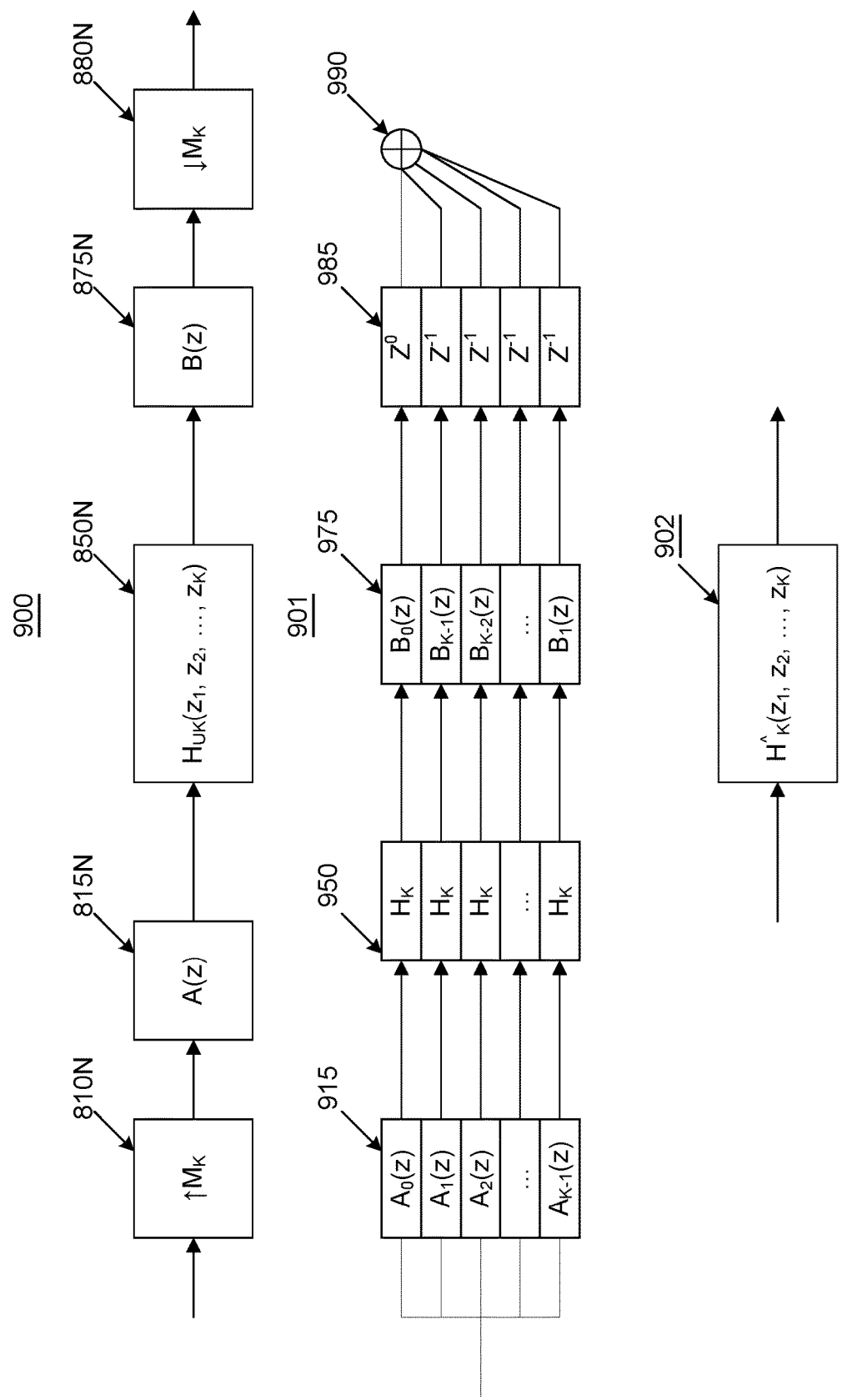
FIG. 9 illustrates a block diagram of a polyphase Volterra compensator and equivalent Volterra compensator according to embodiments of the invention.

FIG. 9 depicts the multi-rate Volterra compensator 800 implemented in an efficient polyphase Volterra configuration 901. A generalized version of the $k^{th}$ order processing arm shown in FIG. 8 including upsampler 810N, bandpass filter 815N, upsampled $k^{th}$ order Volterra filter 850N, bandpass filter 875N, and downsampler 880N is shown as 900 in FIG. 9. The processing arm 900 in FIG. 9 is more general than that of FIG. 8 since it optionally allows the bandpass filter A(z) 810N to be different than the bandpass filter B(z) 875N.

The polyphase Volterra filter 901 in FIG. 9 is used, which is mathematically equivalent to the $k^{th}$ order processing arm 900. The polyphase Volterra filter 901 includes polyphase bandpass filters 915, downsampled Volterra filters 950, polyphase bandpass filters 975, and delays 985 and a summer 990. The polyphase bandpass filters 915 and 975 are the $M_k$ polyphase components of the filters A(z) 810N and B(z) 880N respectively, which are readily determined by one skilled in the art. The downsampled Volterra filters 950 correspond to the non-zero kernel coefficients of the upsampled Volterra filter 850N; in other words, the Volterra filters 950 are multi-dimensionally downsampled by $M_k$ to remove the added zeros in the upsampled Volterra filters 850N. The polyphase Volterra filter 901 is significantly more efficient to implement in hardware than the processing arm 900 since it is processed at the lower (i.e., non-upsampled) data rate. This corresponds to a smaller, lower power, lower cost hardware implementation.

An equivalent Volterra filter $\hat{H}_k$ 902 may optionally be used. The cascade of each polyphase bandpass filter 915, downsampled Volterra filter 950, and polyphase bandpass filter 975 is mathematically equivalent to the multi-dimensional convolution of the tensor outer product of the polyphase bandpass filters 915, the downsampled Volterra filter 950, and a multi-dimensional diagonal matrix containing the coefficients of the polyphase bandpass filter 975. This property allows the polyphase Volterra filter 901 to be optionally implemented in a single, equivalent Volterra filter 902. This equivalent Volterra filter 902 can then be factored and simplified into a set of parallel FIR filters as described below for an efficient hardware implementation.

Figure 10:
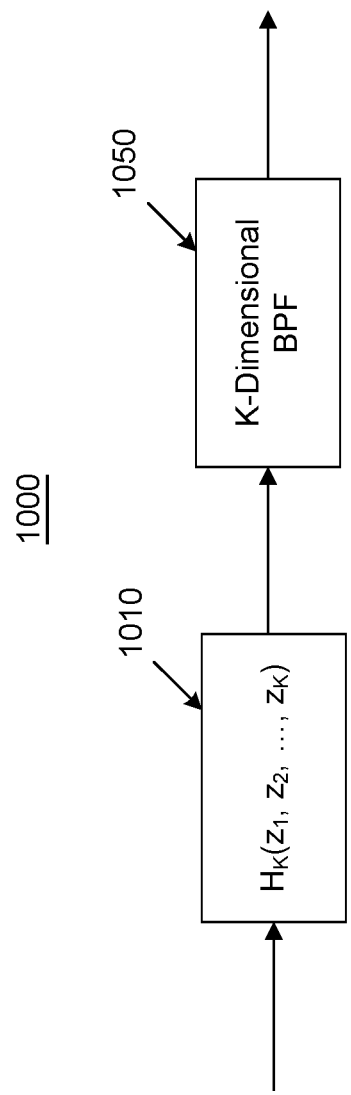
FIG. 10 illustrates a block diagram of a Volterra compensator with a K-dimensional bandpass filter according to an embodiment of the invention.

FIG. 10 illustrates an arbitrary Volterra filter 1010 is convolved with a multi-dimensional bandpass filter 1050 to attenuate high-frequency intermodulation distortion components that would otherwise exceed the Nyquist criterion and cause aliasing errors. The purpose of the multi-rate Volterra filtering techniques discussed above is to unambiguously resolve these super-Nyquist frequency components through bandpass interpolation, which effectively increases the sample rate such that the frequency of these components now satisfy the Nyquist criterion. However, the multi-dimensional Volterra filter has the ability to properly and unambiguously resolve the frequency response of these high frequency components itself without any sample rate increase since the extra dimensions of the filter have the necessary mathematical degrees of freedom. Without any sample rate increase, these super Nyquist components can otherwise cause aliasing. Aliasing of high frequency non-linear distortion is commonplace with devices such as analog-to-digital converters, so this is a very useful and efficient property of the Volterra filter in those cases.

However, for devices such as radio frequency power amplifiers, high frequency distortion components are not subject to aliasing since they are analog, continuous-time devices. In these cases, a multi-dimensional, preferably linear phase, bandpass filter 1050 is designed (using standard linear phase filter design techniques familiar to those skilled in the art) to attenuate the out-of-band distortion components and prevent aliasing errors. The multi-dimensional bandpass filter 1050 is convolved with the original Volterra filter 1010 to produce a new bandpass Volterra filter 1000 without aliasing errors. This allows the use of a small size original Volterra filter 1010, whose coefficients can be estimated more quickly and with less processing resources while accurately approximating the desired frequency response. Then this Volterra filter 1010 is augmented by multi-dimensional convolution with an appropriate multi-dimensional bandpass filter 1050 to prevent aliasing errors. This bandpass Volterra filter 1000 can then be factored and simplified into a set of parallel finite impulse response (FIR) filter as described below for an efficient hardware implementation.

Referring back to FIG. 8, upsamplers in 810A-N are not used. This oversampled compensator system is configured to operate on a bandlimited subband that is a portion of the full Nyquist bandwidth of the system and such that the high frequency distortion does not violate the Nyquist criterion and therefore no aliasing occurs. For example, a power amplifier pre-distortion linearization compensator is operated at a sample rate of 3 GHz but the desired band to compensated is only zero to 200 MHz and the highest order to be compensated is the fifth order. The highest frequency distortion components can appear at no greater than 1000 MHz, which is within the 1.5 GHz Nyquist zone of the system. Therefore, no upsampling is necessary since the system is already free of aliasing because it is oversampled.

In this alternative embodiment, the oversampled compensator system uses upsampled Volterra filters 850A-850N. As previously mentioned, since only a subset of Volterra kernel coefficients are non-zero, this greatly reduces the size of the hardware implementation since the many zero coefficients correspond to simple time delays instead of full multipliers. Furthermore, the bandpass decimators 880A-N may be implemented digitally or, alternatively, analog bandpass filters may be used to limit the bandwidth of the desired compensation signal.

The efficiency of the measurement of the Volterra kernels is greatly simplified due to the symmetry of the Volterra kernels, $h_n[k_1, k_2, \ldots k_n]$. The kernels $h_n[k_1, k_2, \ldots k_n]$ are equal for all permutations of $k_1, k_2, \ldots k_n$. This leads to very symmetric kernels in both the time-domain and the frequency-domain and super-symmetric factorization, which is described below.

To account for parameters that may drift over time and temperature, the device or system being compensated can be taken offline periodically for recalibration using the multi-tone harmonic probing approach discussed above.

The system can be adaptively calibrated in accordance with methods described above. In addition, correlation techniques can be used to estimate Volterra kernels for arbitrary inputs. Orthogonal factorizations of the Volterra kernels can be used for statistical independence, thereby simplifying the correlation measurements. The adaptive calibration can intelligently update factory calibration measurements and combine measurements over time, temperature, signal content, etc. as described above.

The calculation of Volterra kernel coefficients is performed with an over-constrained linear least mean squares filter design with filter weighting. A matrix of Volterra kernel coefficients is scaled by the measured complex frequency response. The real and complex parts are evaluated and subtracted from the measurement. This process is repeated for at least as many measurements as there are unique Volterra kernel coefficients. The kernel coefficients are calculated with an over-constrained least-squares solution with optional weighting of the form $$WAx = Wb,$$

Where W is the weighting function (to optionally weight certain measurements or frequencies), x is a vector of estimates of the time-domain Volterra kernel, b is a vector of real and imaginary frequency response measurements, and A is a matrix corresponding to the frequencies of each measurement. The solution for the optimal Volterra kernel x via the over-constrained least-squares problem is $$x=inv(A'WWA)A'WWb$$

This represents a very efficient, non-iterative solution via matrix algebra. Weighting is used to help ignore bands where signals will never fall. This approach can be extended to a MINIMAX (minimize maximum error signal), the implementation of which is apparent to one of ordinary skill in the art, by iteratively adjusting the weighting of each measured frequency by a factor proportional to its amplitude. Therefore, larger amplitude error signals will get a higher weighting. The iteration is continued until it converges to the MINIMAX solution.

The calculation of Volterra kernel coefficients is performed via interpolation and extrapolation to uniform frequencies such that the computationally-efficient inverse Fourier transform can be used to estimate the kernel. Data at measured frequencies can be interpolated and extrapolate (e.g., using a cubic spline) to a set of uniformly-spaced frequencies corresponding to those of a Fast Fourier Transform (FFT). The inverse FFT translates these frequency-domain measurements to time-domain Volterra kernels. Forcing conjugate symmetry in the FFT measurements insures that real-valued (not imaginary) coefficients will be calculated for the Volterra kernels. Most stable, realistic systems exhibit fading memory where the amplitudes of the Volterra kernels decrease to negligible levels as the Volterra matrix gets larger. This inverse FFT filter design method can be used to easily calculate very large Volterra matrices, much longer than the anticipated fading memory size. A large inverse FFT also avoids frequency aliasing which could otherwise decrease the accuracy of the calculated Volterra kernel coefficients. A subset of the Volterra kernel can be selected by windowing the matrix centered on the maximum magnitude kernel coefficients. However, this method does not have a frequency weighting capability, so it may not be the optimal solution for a different error criterion. In that case, it may be used as a starting point for other optimizations, such as an iterative solution.

The calculation of Volterra kernel coefficients is performed via an iterative linear or non-linear optimization. Volterra kernel coefficients can be iteratively adjusted and compared in a mean squares sense to the measured data, and the iteration continues until it converges to a solution.

For higher-order implementations of the factored Volterra compensator (i.e., order greater than 3), it becomes necessary to discriminate between overlapping kernels. Higher-order kernels have overlapping frequency components with lower-order kernels (e.g., some fifth-order intermodulation components are the same frequency as the third-order intermodulation components). The higher-order kernels can be measured at non-overlapping frequencies, followed by measuring the lower-order kernels by subtracting out overlapping components. Alternatively, kernels can be measured at multiple signal amplitudes and the different orders can be discriminated by their variations in amplitude (e.g., if the input amplitude is lowered by 1 dB, then the third-order components are reduced by 3 dB and the fifth-order components are reduced by 5 dB).

While it is possible to implement Volterra kernels as brute force multiplication and addition of all components, this is a very inefficient method requiring impractical amounts of processing resources, large size, high power consumption, and high cost. In an embodiment of the invention, the Volterra kernel is factored into dominant components and a very accurate but efficient implementation of the kernel is performed by implementing only the most significant components. Insignificant factors can be ignored to significantly reduce the size with negligible impact on the performance. A factorization (also called decomposition) method called Singular Value Decomposition (SVD) is effective for second-order Volterra kernels, and a factorization method called Tucker Decompositions is effective for higher-order Volterra kernels (i.e., $3^{rd}$ order and greater). As discussed above, symmetry of the Volterra kernel leads to super-symmetric factorizations, which are extremely efficient. Note that these factorizations are exact implementations of the Volterra kernel if all factorization components are implemented. However, the benefit of the factorizations is the ability to decompose the Volterra kernels into its factors, rank the factors by the significance of their contribution, and elect to implement the most significant factors necessary for the desired level of performance.

The Volterra kernels can be implemented as a parallel filter bank followed by a memoryless nonlinear combination of polynomials. If the memory of Volterra kernel is L (i.e., $h_n$ is an L×L×L×... tensor), then there are at most L filters in the parallel filter bank, each with L coefficients. The maximum number of memoryless nonlinear combination is $L^k$ (L=memory, k=Volterra order). The coefficients are quantized for implementation in efficient fixed-point arithmetic. Alternatively, the implementation can be floating point arithmetic for improved accuracy but requiring more processing resources.

The Volterra kernels can be factored by implementing only the dominant diagonals and off-diagonals of Volterra kernel matrices. Often, the dominant energy in the Volterra kernel is concentrated on a few diagonals, so this factorization method can provide high accuracy with low computational complexity. A key to significantly reducing the complexity of implementing the Volterra filtering is to exploit the extreme symmetry inherent in the Volterra kernels, namely, $h_m[k_1, k_2, \ldots, k_m]$ are identically equal for all permutations of $[k_1, k_2, \ldots, k_m]$. This dramatically reduces the implementation complexity from $K^m$ total coefficients to $$\binom{K+m-1}{m}$$

unique coefficients. For example, a fifth-order Volterra kernel (m=5) with memory K=8 has 32,768 total coefficients, of which 792 are unique (a reduction of over 97%).

The unique, symmetric coefficients correspond to the diagonal and upper off-diagonal coefficients of the multi-dimensional Volterra kernels (which are matrices for two-dimensional kernels and tensors for higher order kernels greater than second order). Each diagonal and off-diagonal component can be efficiently implemented as an FIR filter. Each FIR filter can be rank-ordered by a measure of the energy in each (e.g., the sum of the squares of the filter coefficients). To reduce the complexity of the implementation, an accurate approximation of the Volterra kernel can be implemented by retaining only the FIR filters with energy above a prescribed threshold.

Figure 11:
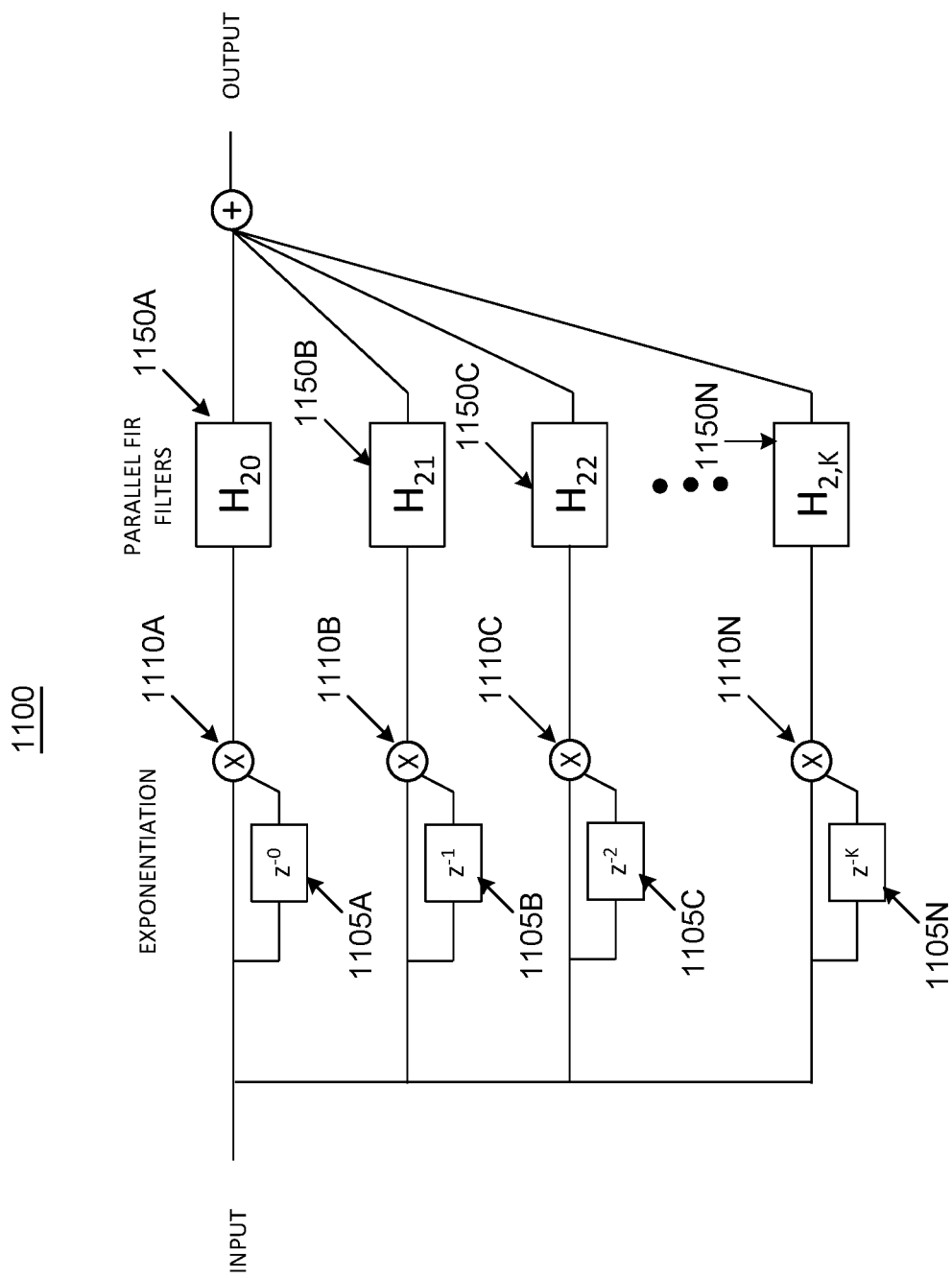
FIG. 11 illustrates the structure of the second-order factored Volterra compensator according to a preferred embodiment of the invention.

FIG. 11 depicts a preferred second-order Volterra kernel 1100 implemented with second-order exponentiators 1110A-N and parallel FIR filters 1150A-N. The parallel FIR filters correspond to the unique diagonal and upper off-diagonal coefficients of the Volterra kernel. The exponentiators 1110A-N are implemented with two-input multipliers whose inputs correspond to the Volterra filter input and a delayed version of the Volterra filter input using delays 1105A-N. The diagonal of the Volterra kernel corresponds to the case where the delay 1105A is zero, the first upper off-diagonal of the Volterra kernel corresponds to the case where the delay 1105B is one, and likewise for the other upper off-diagonals.

Figure 12:
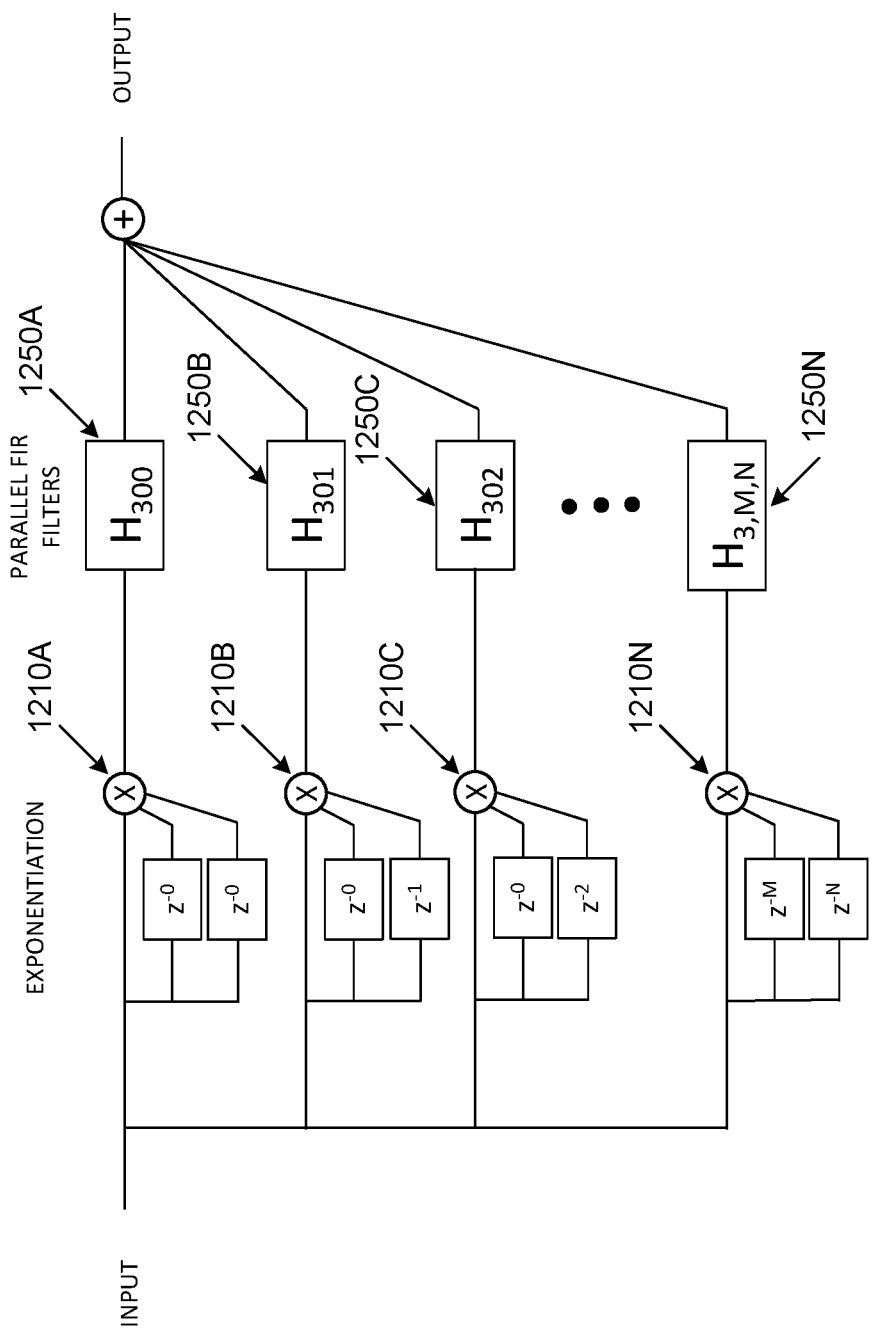
FIG. 12 illustrates the structure of the third-order factored Volterra compensator according to a preferred embodiment of the invention.

Similarly, FIG. 12 depicts a preferred third-order Volterra kernel implemented with third-order exponentiators 1210A-N and parallel FIR filters 1250A-N. Again, the parallel FIR filters correspond to the unique diagonal and upper off-diagonal coefficients of the Volterra kernel. The exponentiators 1210A-N are implemented with three-input multipliers whose inputs correspond to the Volterra filter input and delayed versions of the Volterra filter. This same structure is readily extended to higher order Volterra kernels for similarly efficient implementations of arbitrary order Volterra filters.

For very wideband applications, the second-order FIR filters 1150A-N in FIG. 11 can be implemented as previously described and shown in FIG. 7 in a parallel polyphase configuration 700 at a significantly reduced sample rate. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. The third-order FIR filters 1250A-N in FIG. 12 and higher-order FIR filters (not shown) can be similarly implemented in a parallel polyphase configuration.

Once the Volterra kernels have been factored, they are rank ordered according to their significance (e.g., their singular values, Tucker factors, or other measurement of the relative energy in the Volterra kernel). Factored components are progressively included in the implementation until a desired level of performance or computational complexity limit has been reached. Once the Volterra kernels have been decomposed into their dominant factors, the compensation system for weakly nonlinear systems (i.e., a system where the nonlinear distortion is much, much smaller than the fundamental signals) is implemented by negating the Volterra kernels above the first order. The first order term passes the fundamental signal through the compensator in phase, and the kernels above the first order are negated such that they are subtracted from the output, thereby canceling the nonlinear distortion.

Figure 13:
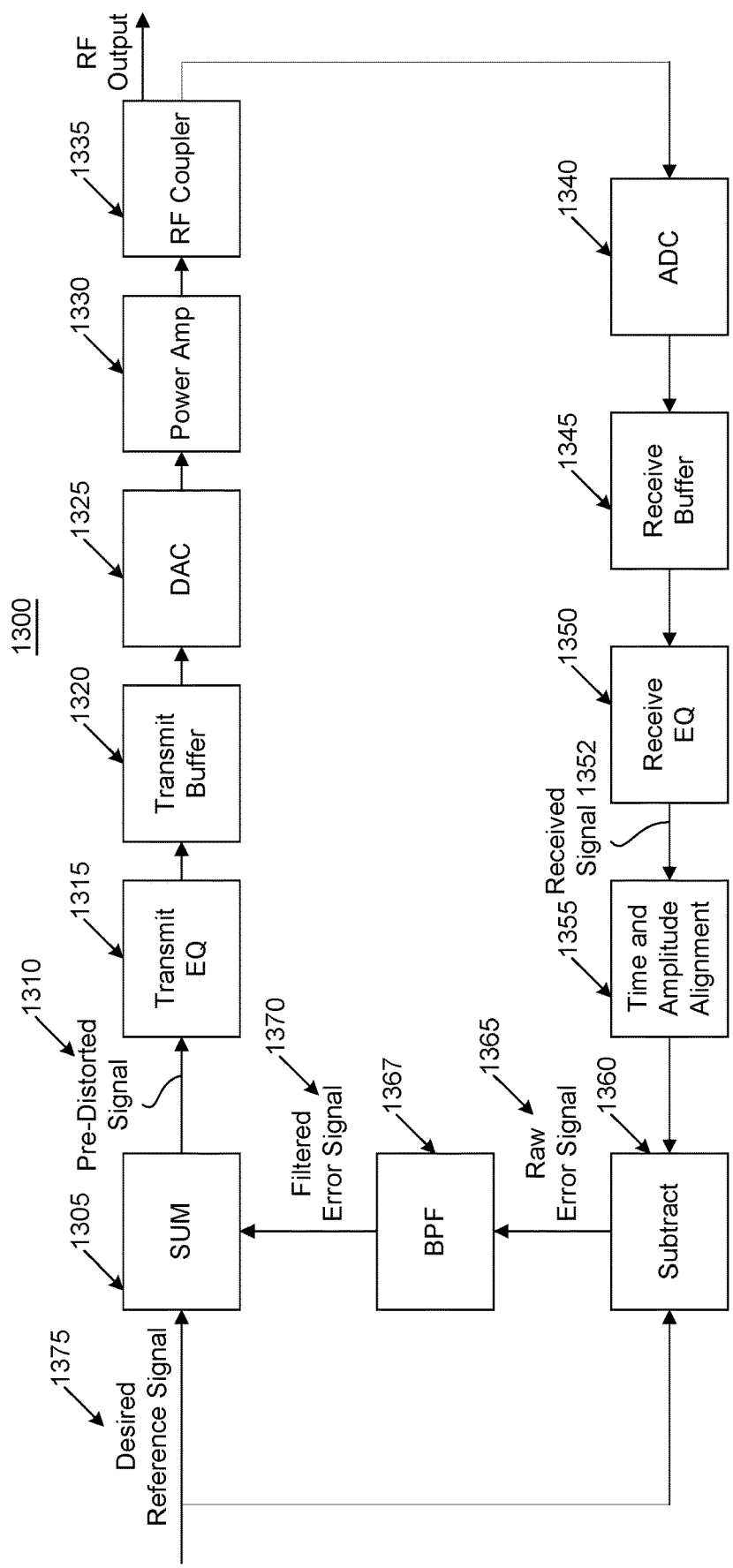
FIG. 13 illustrates a compensator calibration system.

To determine the appropriate Volterra kernel for a strongly nonlinear system (i.e., a system where the nonlinear distortion is roughly the same order as the fundamental signals), a preferred embodiment of the invention uses an iterative calibration algorithm 1300 to converge to a suitable result, as shown in FIG. 13. The iterative algorithm uses a series of multi-tone calibration signals with frequencies appropriately chosen to avoid overlapping distortion components, as described previously. Other non-sinusoidal signal types, such as pseudo-random, bandpass, spread spectrum or other modulated waveforms may also be used with this method.

During system calibration for a strongly nonlinear pre-compensation system such as digital pre-distortion of RF power amplifiers, for each calibration signal, the desired signal 1375 is iteratively adjusted to create a pre-distorted signal 1310 such that, when distorted by the RF power amplifier 1330, the output of the power amplifier 1330 closely matches the desired signal 1375.

The desired signal 1375 is digitally generated (e.g., on a computer or in an in-system embedded processor) and, on the first iteration of the algorithm, stored in a transmit buffer memory 1320 and converted to an analog signal with a digital-to-analog converter 1325. This signal is amplified by the RF power amplifier under test 1330 and the amplifier output is coupled with an RF coupler 1335 to an analog-to-digital converter 1340. The analog-to-digital converter output is captured in receive buffer memory 1345. The received signal 1352 accurately represents the output of the RF power amplifier 1330. The gain and delay of the received signal 1352 is adjusted in block 1355 (described further below) and compared to the desired signal 1375 via subtraction 1360 to create error signal 1370. On the second and subsequent iterations of the algorithm, the error signal 1370 is added to the desired signal 1375 with summer 1305 to create a new pre-distorted signal 1310. The process is repeated until the level of the error signal 1370 is below a prescribed threshold, indicating that the algorithm has converged to an appropriate solution. Once this occurs, both the desired signal 1375 and the final pre-distorted signal 1310 are saved in memory and the process is optionally repeated for another calibration signal.

The time and amplitude alignment block 1355 includes a digital gain element (e.g., a digital multiplier) to compensate for the gain of the RF power amplifier and a delay adjustment (e.g., delay elements) to compensate for the time delay of the DAC 1325 and transmit electronics (not shown), RF power amplifier 1330, RF coupler 1335, ADC 1340 and receive electronic (not shown).

The iterative calibration algorithm shown may optionally include a DAC equalization filter 1315 to compensate for any amplitude and phase distortion caused by the digital-to-analog converter and associated transmit electronics. The transmit electronics may include RF filters or mixers (not shown) to change the frequency of the transmitted signal. The algorithm may also optionally include an ADC equalization filter 1350 to compensate for any amplitude and phase distortion caused by the analog-to-digital converter and associated receive electronics. The receive electronics may include RF filters or mixers (not shown) to change the frequency of the received signal. The algorithm may optional include a bandpass filter 1367 to limit the bandwidth of the correction signal to a prescribed frequency band.

Once the iterative algorithm has been used with a multiplicity of calibration signals, the saved sets of corresponding desired signals 1375 and pre-distorted signals 1310 are used with the harmonic probing process previously described to determine the appropriate Volterra kernel or kernels. These Volterra kernels represent the pre-inverse Volterra filters that effectively compensate for the nonlinear distortion of a system such as an RF power amplifier. These Volterra filters can be efficiently implemented in hardware using the factorization techniques previously described.

The aforementioned approach, while providing excellent linearization in a calibrated laboratory environment, will yield sub-optimal performance when employed in the field due to a variety of changing conditions, such as temperature. By design, the above approach requires a priori fitting in order to learn the Volterra model necessary to effectively compensate the nonlinear distortion present. As a result, such a system requires a great deal of data in the calibration stage to attempt to capture the variety of conditions experienced in the hardware. The following approach, however, eliminates the need for a calibration stage by positing an adaptive approach to cancel out nonlinearities.

The present invention provides a dynamic or "on the fly" process of adaptively estimating a Volterra model predistortion linearizer for a nonlinear system without the need for any a priori model fitting. While the following derivation is shown for a third-order system, one of ordinary skill in the art can readily appreciates that it can be extended to higher orders.

Figure 14A:
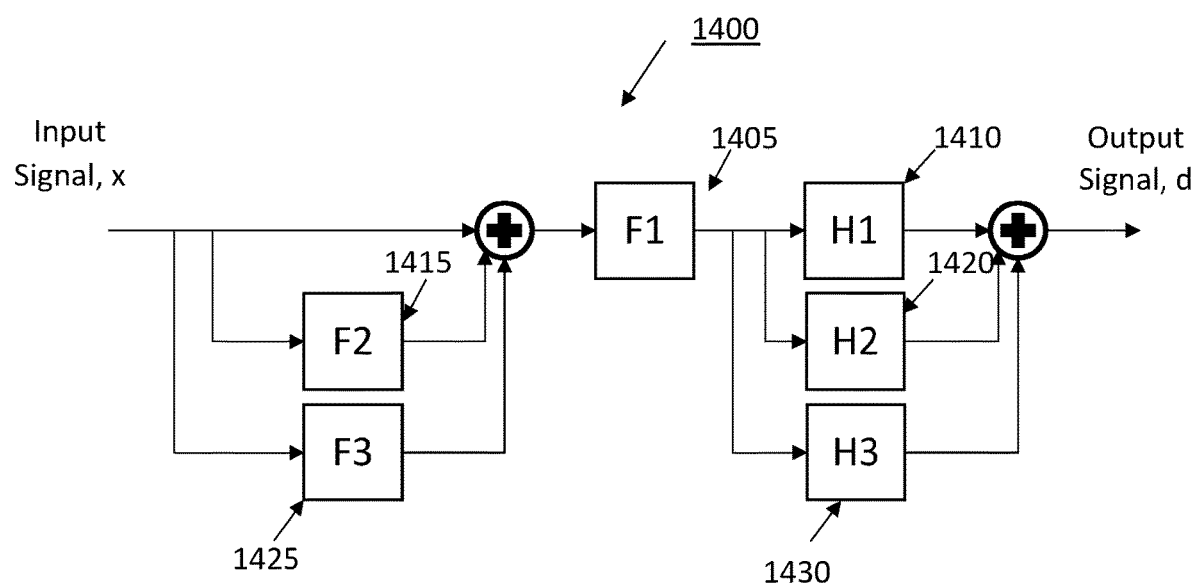
FIG. 14A illustrates adaptive estimation of third-order factored Volterra predistortion linearizer for a nonlinear system according to an embodiment of the invention.

FIG. 14A illustrates adaptive estimation 1400 of a third-order Volterra predistortion linearizer for a nonlinear system according to an embodiment of the invention. H1-H3 represent a third-order Volterra nonlinear system comprising first-order Volterra kernel 1410, second-order Volterra kernel 1420, and third-order Volterra kernel 1430. F1-F3 represent a third-order Volterra predistortion linearizer comprising first-order inverse Volterra kernel 1405, second-order inverse Volterra kernel 1415, and third-order Volterra kernel 1425. The inverse Volterra kernels 1405-1425 receive an input signal, x, and, once processed through the Volterra nonlinear system represented by Volterra kernels 1410-1430, produce the output signal, d, such that the nonlinearities have been cancelled.

The nonlinear device being linearized, such as an RF power amplifier, is mathematically modeled as a Volterra nonlinear system comprising Volterra kernels 1410-1430 using an adaptive estimation algorithm described below. These Volterra kernels 1410-1430 are then used to calculate the corresponding inverse Volterra kernels 1405-1425 to cancel the nonlinear distortion introduced by the nonlinear device in a process also described below.

In a preferred embodiment, the inverse Volterra kernels 1405-1425 can be implemented in hardware for realtime processing as a second-order Volterra kernel 1100 shown in FIG. 11 and third-order Volterra kernel shown in FIG. 12. For very wideband applications, the kernels can be implemented as previously described and shown in FIG. 7 in a parallel polyphase configuration 700 at a significantly reduced sample rate.

In another embodiment, the actual inverse Volterra filters 1405-1425 are implemented in realtime hardware such as FGPA as shown in FIG. 11 and FIG. 12 (with polyphase filtering shown in FIG. 7). The Volterra kernels 1410-1430 are not implemented but instead are interim calculations used to determine the inverse Volterra filters 1405-1425.

The optimal inverse of an $N^{th}$ order Volterra system is defined as:

$$Y_N = Y_1 - F_1 \sum_{k=2}^{N} H_k Y_{N-k+1}, \text{ where } Y_1 = F_1 * x \text{ and } F_1 = \frac{1}{H_1}$$

Iteratively computing this compounds the effects of F1, which requires a good estimate of H1. By predistorting the system with F1, the presence of H1 is effectively cancelled out and a new system is produced where the inverse does not depend on H1 (nor does it depend on a need to estimate it):

$$Y_N = x - \sum_{k=2}^{N} H_k Y_{N-k+1}.$$

For a third-order system:

$$Y_3 = x - H_2 Y_2 - H_3 Y_1 = x - H_2 * x - H_3 * x + H_2 * (H_2 * x)$$

The last term will generally produce higher order terms that will be smaller than the nonlinearity to be removed, so this term can be omitted to yield:

$$Y_3 = x - H_2 * x - H_3 * x = x + F_2 * x + F_3 * x$$

This is the system modeled by F2 and F3. Although only a single iteration is depicted in FIGS. 14, F2 and F3 are iteratively estimated as the system is predistorted.

To estimate the approximate inverse F1 (or 1/H1), the system is probed with low amplitude single tone signals across the whole Nyquist band, the output is measured, and F1 is recorded as the quotient of the frequency response of the input signal and frequency response of the output signal. These measurements are interpolated and the used for the design of the FIR filter. Once the inverse of H1 is estimated, the system is predistorted with it in order to estimate the pseudo-inverse, F1.

For each iteration, 1420 (H2) and 1430 (H3) are estimated via a modified recursive least squares (RLS) algorithm. The standard RLS algorithm steps are described by equations 1-6 and the inventive steps are described by equations 7-9 as follows. For N iterations, compute the following:

$$k(n) = \frac{\lambda^{-1} P(n-1) u(n)}{1 + \lambda^{-1} u^H(n) P(n-1) u(n)} \quad \text{(equation 1)}$$

$$y(n) = w^T(n-1) u(n) \quad \text{(equation 2)}$$

$$e(n) = d(n) - y(n) \quad \text{(equation 3)}$$

$$w(n) = w(n-1) + k(n) e(n) \quad \text{(equation 4)}$$

$$P(n) = \lambda^{-1} P((n-1) - \lambda^{-1} k(n) u^H(n) P(n-1) \quad \text{(equation 5)}$$

$$mse(n) = e(n) * e(n) \quad \text{(equation 6)}$$

$$mse10(n) = \frac{1}{10} \sum_{k=n-9}^{n} mse(k) \quad \text{(equation 7)}$$

$$mse100(n) = \frac{1}{100} \sum_{k=n-99}^{n} mse(k) \quad \text{(equation 8)}$$

$$\text{if}(mse10(n) - mse100(n) > 5 \text{ dB}), \text{reset} P(n) \text{ to } I \quad \text{(equation 9)}$$

where $\lambda^{-1}$ denotes the reciprocal of the exponential weighting factor (also called the forgetting factor), n is the current time index, u(n) is the vector of input samples, P(n) is the inverse correlation matrix, k(n) is the gain vector, w(n) is the filter tap estimates of the vectorized Volterra coefficients, y(n) is the estimated output of the filter, e(n) is the estimation error, and d(n) is the desired output, mse(n) is the mean-squared error (MSE), mse10 is a 10-sample moving average of the MSE, mse100 is a 100-sample moving average of the MSE, and I is the identity matrix.

The standard RLS algorithm computes the mean-squared error sample-by-sample to find the optimal solution. However, in order to allow filtering to be incorporated into the model, the output of the system is estimated for the full data vector at each iteration. This provides a more robust and stable objective function than the sample-by-sample mean-squared error computation. Once the MSE is computed for all N iterations, optimization over all coefficients is performed by choosing the coefficients that minimize the objective function $$\min_k[\text{std}[d - y(k)]].$$

The system is then predistorted with the estimated F2 and F3, and the estimation is repeated until convergence. F2 and F3 are computed as the negated accumulation of the H2 and H3 estimates from pervious iterations scaled by a convergence controlling factor, alpha. In other words:

$$F_2(n) = -\alpha \sum_{i=1}^{n-1} H_2(i)$$

$$F_3(n) = -\alpha \sum_{i=1}^{n-1} H_3(i)$$

Figure 14B:
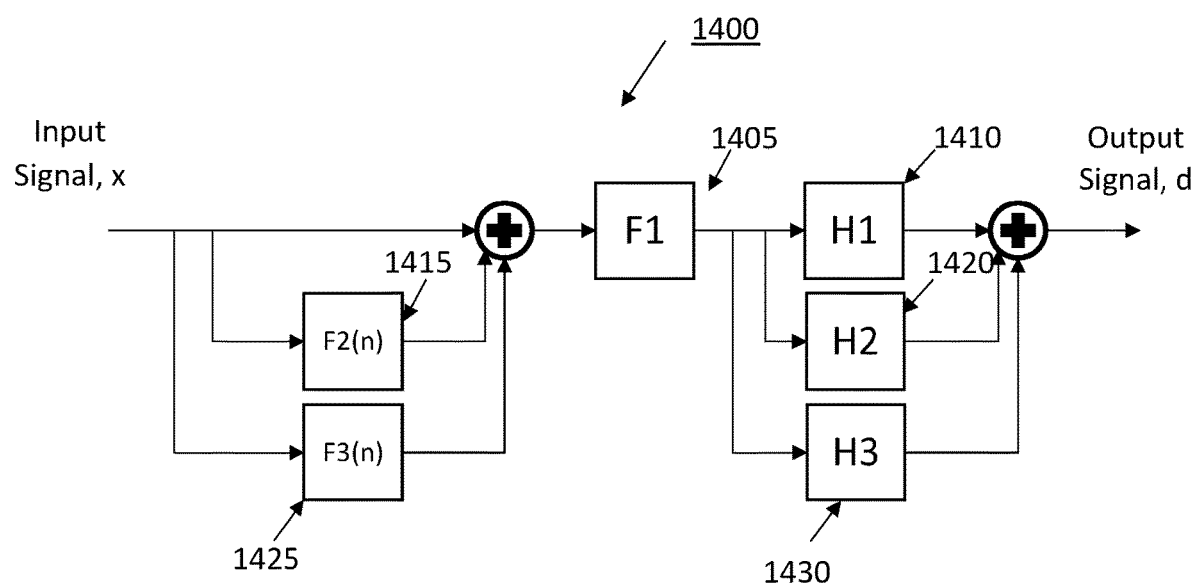
FIG. 14B illustrates adaptive estimation of third-order factored Volterra predistortion linearizer for a nonlinear system at iteration n according to an embodiment of the invention.

FIG. 14B illustrates adaptive estimation 1400 of third-order factored Volterra predistortion for a nonlinear system at iteration n according to an embodiment of the invention.

In a preferred embodiment, the adaptive estimation algorithm described above can be implemented as firmware in a processor such as a digital signal processor (DSP), embedded processor, or a microprocessor. For faster update rates, some of the computations can be implemented in dedicated hardware such as FPGA or ASIC logic. Furthermore, the implementation of the actual compensator in the FPGA is simply 1405-1425 (F1-F3) with its adder. The output of 1405 (F1) represents the predistorted signal which feeds the device being linearized (e.g., RF power amp) such that the output of the device, output signal d, is linearized (i.e., the nonlinear distortion is cancelled). The Volterra kernels 1410-1430 (H1-H3) with its adder is a mathematical model of the device with output signal d.

For bandpass systems in which the waveforms are limited to a certain sub-bandwidth, "prefiltering" the signal is effective since, without the prefiltering, the system is expecting components over a wider bandwidth. In an embodiment of the invention, a bandpass filter is used to filter the data to the desired bandwidth and this filter is included directly in the kernel estimation; the algorithm is able to concentrate on the desired inband signals while ignoring the out-of-band signals. A system that concentrates on the desired inband signals greatly simplifies the Volterra filter design algorithm (described above) and greatly reduces the size of the hardware implementation (since the many zero coefficients correspond to simple time delays instead of full multipliers).

While the present invention has been described for a predistortion linearization application (such as linearization of RF transmit electronics including RF power amplifiers or digital-to-analog converters), it will be readily apparent to one of ordinary skill in the art that the same principles can be applied to a post-distortion linearization application (such as linearization of RF receive electronics, including low noise amplifiers or analog-to-digital converters).

The present invention is applicable to a wide range of military and commercial applications including, but not limited to: advanced radar systems; software-defined radios; multi-beam adaptive digital beamforming array transceivers, smart radios for wireless communications (terrestrial and satellite); wideband electronic warfare transceivers; general test equipment such as oscilloscopes, spectrum analyzers, and network analyzers; special test equipment, wide bandwidth modems, anti jam global positioning system (GPS) receivers, and active radar for Earth science measurements.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A Volterra compensator for removing nonlinear distortion introduced by an electronic system, the Volterra compensator comprising:
    an inverse Volterra filter of order N, wherein N is equal to or greater than two;
    an adaptive filter estimator coupled to the inverse Volterra filter, wherein the adaptive filter estimator calculates optimized nonlinear filter coefficients that are computed as an accumulation of multiple iterations scaled by a convergence controlling factor, the optimized nonlinear filter coefficients up to the order N are calculated according to an objective function, and the objective function uses a vector of data at each iteration.

2. The Volterra compensator of claim 1, wherein the adaptive filter estimator calculates optimized nonlinear filter coefficients up to the order N to reduce nonlinear distortion introduced by the electronic system.

3. The Volterra compensator of claim 1, wherein the objective function is dependent on a difference between a desired output of the electronic system and an actual output of the electronic system with the Volterra compensator.

4. The Volterra compensator of claim 1, wherein the inverse Volterra filter of order N and the adaptive filter estimator are implemented in an integrated circuit.

5. The Volterra compensator of claim 4, where the integrated circuit is an embedded processor.

6. The Volterra compensator of claim 1, wherein the adaptive filter estimator comprises a bandpass filter having a predetermined bandwidth.

7. A method for removing nonlinear distortion introduced by an electronic system, the method comprising the steps of:
    applying an inverse Volterra filter of order N to an input signal, wherein N is equal to or greater than two;
    executing an adaptive filter estimator coupled to the inverse Volterra filter, wherein executing the adaptive filter estimator comprises calculating optimized nonlinear filter coefficients that are computed as an accumulation of multiple iterations scaled by a convergence controlling factor, the optimized nonlinear filter coefficients up to the order N are calculated according to an objective function, and the objective function uses a vector of data at each iteration.

8. The method of claim 7, wherein executing the adaptive filter estimator comprises calculating optimized nonlinear filter coefficients up to the order N to reduce nonlinear distortion introduced by the electronic system.

9. The method of claim 7, wherein the objective function is dependent on a difference between a desired output of the electronic system and an actual output of the electronic system with the Volterra compensator.

10. The method of claim 7, wherein the inverse Volterra filter of order N and the adaptive filter estimator are implemented in an integrated circuit.

11. The method of claim 10, where the integrated circuit is an embedded processor.

12. The method of claim 7, wherein the adaptive filter estimator comprises a bandpass filter having a predetermined bandwidth.

* * * * *